United States Patent [19]

Lewis et al.

[11] Patent Number: 4,457,582

[45] Date of Patent: Jul. 3, 1984

[54] FIBRE OPTIC TERMINALS FOR USE WITH BIDIRECTIONAL OPTICAL FIBRES

[75] Inventors: Edward L. Lewis, Maidstone; Robin D. Beasley, Chatham; Trevor A. Morgan, Rainham, all of England

[73] Assignee: Elliott Brothers (London) Limited, London, England

[21] Appl. No.: 964,679

[22] Filed: Nov. 29, 1978

[30] Foreign Application Priority Data

Dec. 23, 1977 [GB] United Kingdom ............... 53688/77

[51] Int. Cl.³ ............................................... G02B 7/26
[52] U.S. Cl. ...................................... 350/96.20; 250/227
[58] Field of Search ............... 350/96.15, 96.16, 96.17, 350/96.20, 96.21; 250/227; 357/19, 30, 74

[56] References Cited

U.S. PATENT DOCUMENTS

| | | | |
|---|---|---|---|
| 3,859,536 | 1/1975 | Thiel | 250/227 X |
| 3,952,265 | 4/1976 | Hunsperger | 350/96.15 X |
| 3,968,564 | 7/1976 | Springthorpe | 350/96.15 X |
| 3,996,526 | 12/1976 | d'Auria et al. | 350/96.15 X |
| 4,030,811 | 6/1977 | Khoe et al. | 350/96.17 |
| 4,075,477 | 2/1978 | Hanson | 250/227 |
| 4,101,197 | 7/1978 | Kent et al. | 350/96.17 |
| 4,118,100 | 10/1978 | Goell et al. | 350/96.20 |
| 4,118,105 | 10/1978 | Voigt | 350/96.20 |
| 4,130,343 | 12/1978 | Miller et al. | 350/96.15 |
| 4,152,713 | 5/1979 | Copeland et al. | 357/19 |
| 4,279,465 | 7/1981 | Vojvodich | 350/96.20 |

FOREIGN PATENT DOCUMENTS

| | | | |
|---|---|---|---|
| 980451 | 12/1975 | Canada | 350/96.17 |
| 2313688 | 12/1976 | France | 350/96.20 |

Primary Examiner—John D. Lee
Attorney, Agent, or Firm—Kirschstein, Kirschstein, Ottinger & Israel

[57] ABSTRACT

A fibre optic terminal (1) for use with a bi-directional optic fibre (6) including an optical receiver (2) positioned in the path of light (8) emitted from an end (5) of the optical fibre to receive the light, and an optical emitter (4) arranged to emit light (7) from a position adjacent the optical receiver onto the end of the optical fibre, the position being in the path of light emitted from the end of the optical fibre so that substantially all of the light emitted from the optical emitter is incident on the end of the optical fibre, and the area from which the optical emitter emits light being small relative to the light receiving area of the optical receiver so that substantially all of the light emitted from the end of the optical fibre is received by the optical receiver.

13 Claims, 10 Drawing Figures

FIBRE OPTIC TERMINALS FOR USE WITH BIDIRECTIONAL OPTICAL FIBRES

This invention relates to fibre optic terminals for use with bidirectional optical fibres, i.e. fibres used to carry signals in both directions.

One known method of achieving such a terminal is to connect the end of a bidirectional optical fibre to a two-way optical "Y" junction and to connect the two arms of the junction, via further optical fibres, to an optical receiver and an optical emitter respectively.

This involves the use of optical components which introduce losses into the system and use up space, which in some system applications may be at a premium.

It is an object of the present invention to provide a fibre optic terminal for use with a bidirectional optical fibre wherein the above mentioned disadvantages may be overcome.

The invention provides a fibre optic terminal for use with a bidirectional optical fibre, the terminal including: an optical receiver which in use of the terminal is positioned adjacent an end of the optical fibre so as to receive light emitted from said end of the optical fibre; and an optical emitter so arranged as in use of the terminal to emit light from a position adjacent said optical receiver directly onto said end of the optical fibre.

It will be appreciated that the end of the optical fibre remote from said end may be connected to another terminal or may be connected to another optical fibre, in the latter case the first mentioned optical fibre acting as an integrating rod.

Preferably said optical receiver and said optical emitter are so arranged that in use of the terminal substantially all of the light emitted from said end of the optical fibre is received by said optical receiver, and substantially all of the light emitted from said optical emitter is incident upon said end of the optical fibre.

Preferably said position adjacent said optical receiver is intermediate said optical receiver and said end of the optical fibre. Preferably the optical emitter arrangement is so arranged as in use of the terminal to mask only a small proportion of the area of the optical receiver surface from said end of the optical fibre.

Preferably said optical emitter is located at said position adjacent said optical receiver; or, alternatively, said optical emitter may be located at a position remote from said position adjacent said optical receiver and light emitted from said optical emitter is fed to said position adjacent said optical receiver via a second optical fibre.

Suitably, where the optical fibre is a single strand optical fibre, said position adjacent said optical receiver may be adjacent said end of the optical fibre and conveniently said optical emitter or an end of the second optical fibre feeding light emitted by said optical emitter respectively may be affixed to said end of the single strand optical fibre. In this case the optical receiver may suitably also be affixed to said end of the single strand optical fibre.

In order to reduce crosstalk between the optical receiver and the optical emitter, said optical receiver and said optical emitter may be positioned at opposite ends of a third optical fibre. In order to further increase electrical isolation the third optical fibre may contain a grounded layer of semiconductor material which is transparent at the optical wavelength of operation of said optical receiver and/or said optical transmitter.

Alternatively said optical receiver may be formed from a semiconductor substrate, said optical emitter being formed in said semiconductor substrate.

Several terminals in accordance with the invention will now be described by way of example, with reference to the accompanying drawings, in which.

Figure 1:
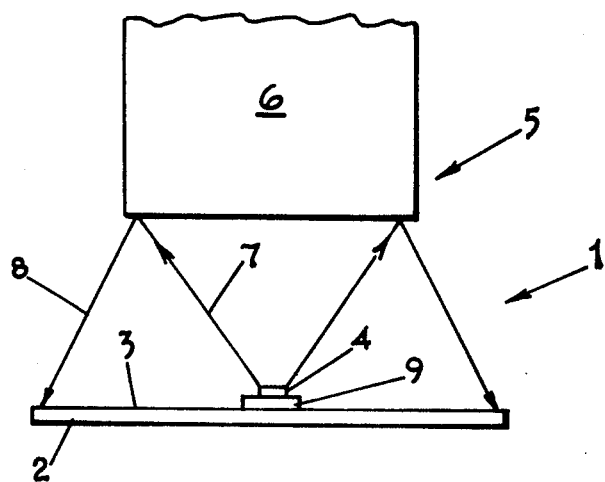
FIG. 1 illustrates a first terminal according to the invention.

Referring firstly to FIG. 1, a terminal 1 includes an optical receiver 2. Mounted on a receiving surface 3 of the receiver 2 is an optical emitter 4. In use of the terminal 1, the receiver 2 is preferably positioned with respect to an end 5 of a bidirectional optical fibre 6 so that the emitter 4 is coaxial with the end 5 of the fibre 6 and substantially the whole of the cone of light 7 emanating from the emitter 4 within the acceptance angle of the end 5 of the fibre 6 falls upon the end 5. The receiver 2 is also so arranged that substantially the whole of the cone of light 8 emanating from the end 5 of the fibre 6 falls upon the receiving surface 3 of the receiver 2.

In this way the terminal 1 operates efficiently in introducing signals into the end 5 of the fibre 6 since substantially all of the light emitted by the emitter 4 within the acceptance angle of the fibre 6 falls upon the end 5 of the fibre 6. The terminal also operates efficiently in receiving signals from the end 5 of the fibre 6 since the area of the receiving surface 3 which is masked by a mount 9 on which the emitter 4 is mounted is small and hence substantially all of the light emitted from the end 5 of the fibre 6 is received by the receiver 2.

The end of the fibre 6 remote from the end 5 may be connected to another terminal or may be connected to another optical fibre as will be described below.

Figure 2:
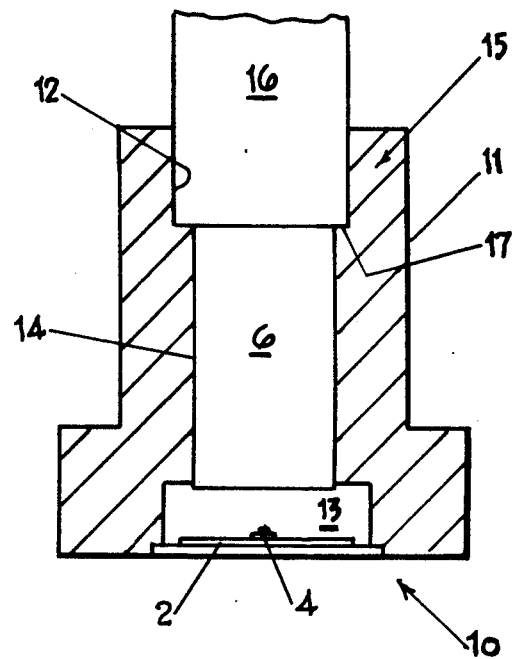
FIG. 2 shows a housing suitable for use in the terminal of FIG. 1.

Referring now to FIG. 2, a housing 10 suitable for use in the terminal 1 comprises a generally cylindrical connector shell 11. The shell 11 has at one end a first central recess 12 for receiving an end of a bidirectional optical fibre 16, and at the other end a second central recess 13 wherein the optical receiver 2 and emitter 4 may be mounted. The two recesses 12 and 13 communicate via an interconnecting conduit 14 in which the optical fibre 6 may be positioned.

In use of the terminal 1 incorporating the housing 10, the optical receiver 2 and emitter 4 and optical fibre 6 are positioned as shown. An end 15 of a bidirectional optical fibre 16 is inserted into the recess 12 until it abuts a shoulder 17 and also abuts the fibre 6. In this way the fibres 6 and 16 are optically joined adjacent the shoulder 17, and signals pass bidirectionally between the two optical fibres 6 and 16. The use of an intermediate optical fibre 6 between the receiver 2 and emitter 4 and the main optical fibre 16 has the advantage that upon insertion of the main optical fibre 16 into the housing 10, no alignment with the receiver 2 and transmitter 4 is necessary, the alignment already having been performed and set with the end 5 of the fibre 6. Also, if the intermediate optical fibre 6 is a single strand optical fibre, the fibre acts as an integrating rod, ensuring even illumination of the fibre 16 at the joint adjacent the shoulder 17.

Figure 3:
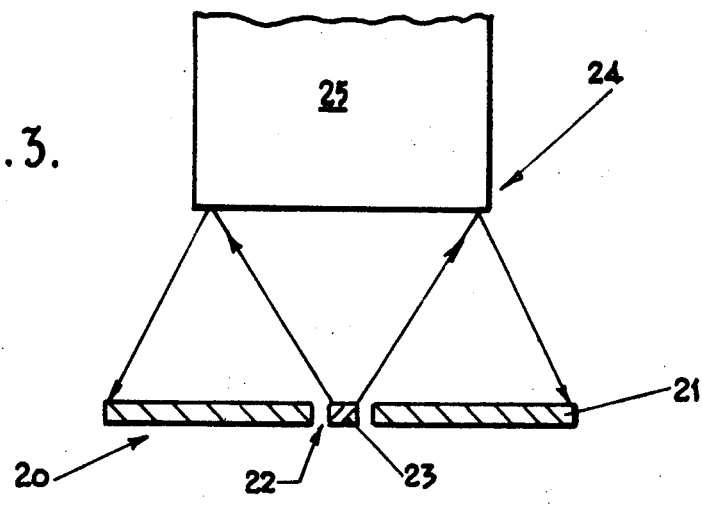
FIGS. 3 to 10 illustrate other terminals according to the invention.

Referring now to FIG. 3, a second terminal 20 in accordance with the invention includes an optical receiver 21, through the centre of which there is provided an aperture 22. An optical emitter 23 is positioned in the aperture 22. It will be appreciated that in use of the terminal 20, the receiver 21 and the emitter 23 are arranged with respect to the end 24 of a bidirectional optical fibre 25 so as to efficiently respectively receive signals from and introduce signals into the end 24.

Figure 4:
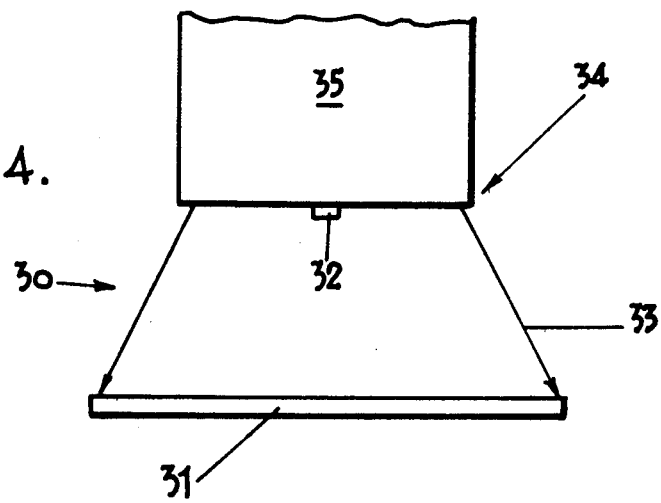

Referring now to FIG. 4, a third terminal 30 in accordance with the invention includes an optical receiver 31 and an optical emitter 32. In use of the terminal 30, the receiver 31 is arranged with respect to an end 34 of a single strand bidirectional optical fibre 35 so that substantially the whole of the cone of light 33 emanating from the end 34 of the fibre 35 is received by the receiver 31, and the emitter 32 is positioned adjacent the end 34 of the fibre 35. The emitter 32 may be affixed to the end 34 of the fibre 35. Positioning the emitter 32 adjacent the end 34 of the fibre 35 is advantageous in that it reduces the constraints on the position and size of the receiver 31.

Figure 5:
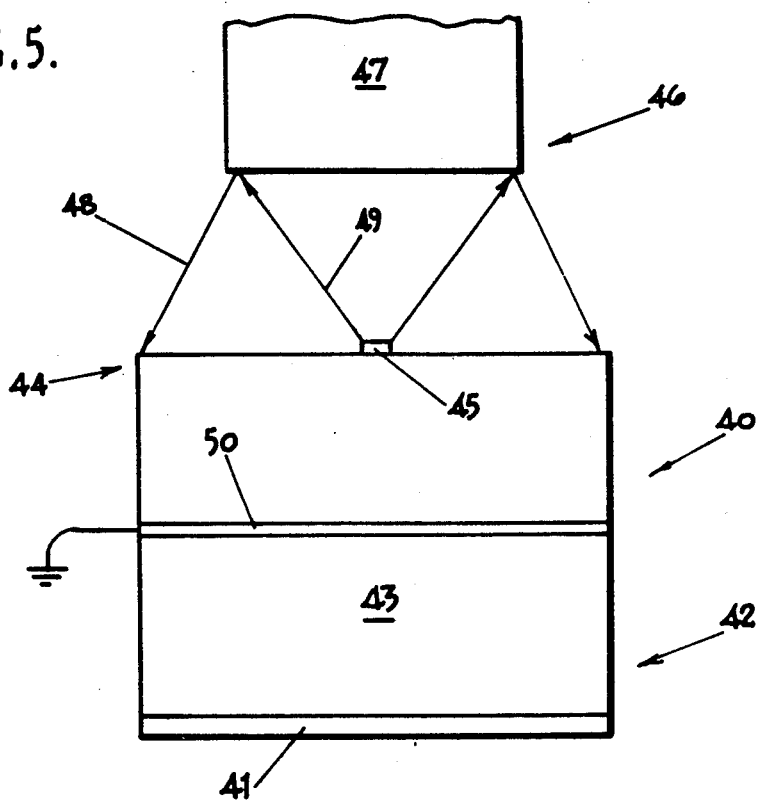

Referring now to FIG. 5, in order to decrease the amount of electrical crosstalk between a receiver and emitter in a terminal according to the invention, a fourth terminal 40 in accordance with the invention includes an optical receiver 41 affixed to one end 42 of a unidirectional optical fibre 43. To the other end 44 of the fibre 43 there is affixed an optical emitter 45. It will be appreciated that in use of the terminal 40, the end 44 of the fibre 43 is arranged with respect to an end 46 of a bidirectional optical fibre 47 so that substantially the whole of the cone of light 49 emanating from the emitter within the acceptance angle of the end 46 of the fibre 47 falls upon the end 46. The end 44 of the fibre 43, it will further be appreciated, is so arranged that substantially the whole of the cone of light 48 emanating from the end 46 of the fibre 47 falls upon the end 44 of the fibre 43 within the angle of acceptance of the end 44 of the fibre 43. This light is passed through the fibre 43 to the receiver 41.

In order further to increase the electrical isolation between the receiver 41 and the emitter 45 there is provided in the fibre 43 a grounded layer 50 of semiconductor material. The semiconductor material of the layer 50 is chosen to be transparent to light at the optical wavelength of the received light.

Figure 6:
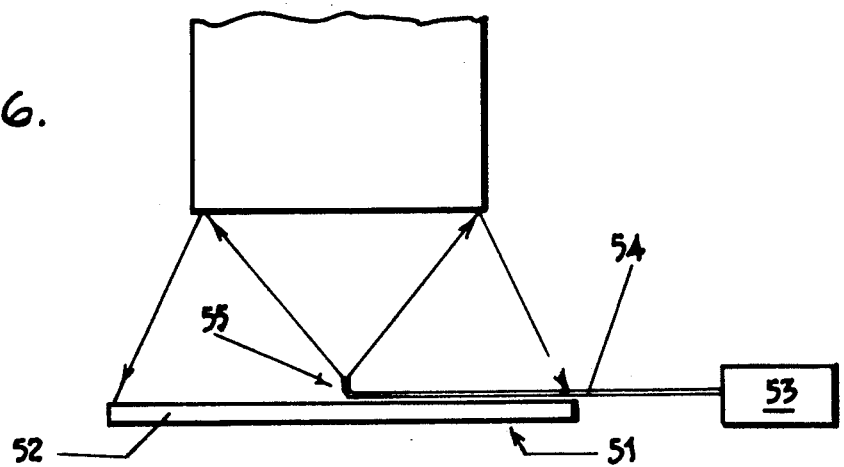

FIG. 6 illustrates a fifth terminal 51, in which the reduction of the effective surface area of the receiving surface of the receiver due to the presence of the emitter adjacent the surface, e.g. by masking as in terminal 1 or by necessitating a hole in the area to be provided as in terminal 20, may be partially alleviated. The terminal 51 includes an optical receiver 52. An optical emitter 53 is positioned remote from the receiver 52. Light emitted by the emitter 53 is fed to a point adjacent the receiver 52 via a thin optical fibre 54. The fibre 54 is bent at its end 55 adjacent the receiver 52 so that light emitted by the emitter 53 emanates from the end 55 of the fibre 54 in the same way as if the emitter itself were placed where the end 55 of the fibre is (e.g. as in terminal 1). Remote positioning of the emitter from the receiver also has the advantage of reducing the possibility of crosstalk between the receiver and emitter.

Figure 7:
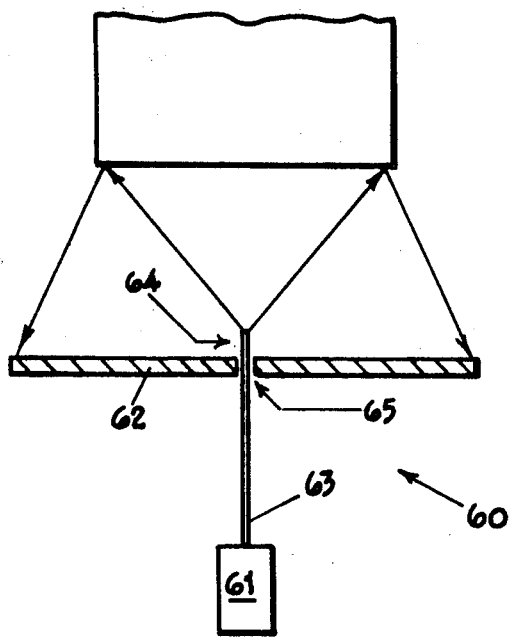

FIG. 7 illustrates a sixth terminal 60, similar to the terminal 51, in which an optical emitter 61 is positioned remote from an optical receiver 62. The positioning, however, obviates the need for a bend in a thin optical fibre 63 as in terminal 51. In terminal 60 an end 64 of the fibre 63 is brought to a point adjacent the receiver 62 through a small aperture 65 in the receiver 62. In this way the reduction in the effective surface area of the receiving surface of the receiver 62 due to the presence of the optical fibre 63 is alleviated over terminal 51.

Figure 8:
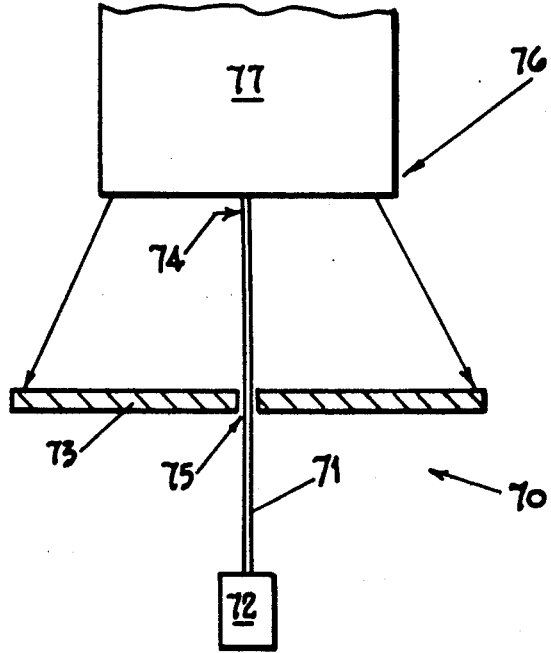
Figure 9:
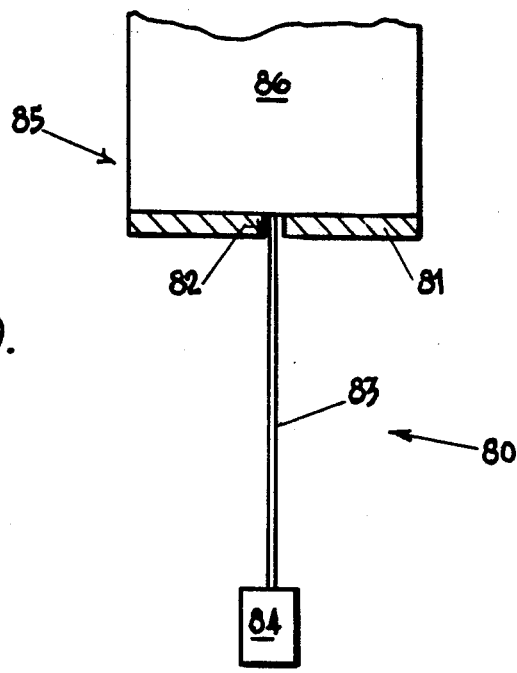

FIGS. 8 and 9 illustrate terminals which are variations of terminal 60. In FIG. 8 a seventh terminal 70 includes a thin optical fibre 71 via which light emitted from an optical emitter 72 positioned remote from an optical receiver 73 is fed. An end 74 of the fibre 71 remote from the emitter 72 is brought through a small aperture 75 in the receiver 73 and positioned so as in use of the terminal to be adjacent an end 76 of a single strand bidirectional optical fibre 77. The end 74 of the fibre 71 may be affixed to the end 76 of the fibre 77.

In FIG. 9 an eighth terminal 80 is similar to terminal 70 but has an optical receiver 81, like the end 82 of a thin optical fibre 83 feeding light from an optical emitter 84, positioned so as in use of the terminal to be adjacent an end 85 of a single strand bidirectional optical fibre 86. Like the end 82 of the fibre 83, the receiver 81 may be affixed to the end 85 of the fibre 86.

Figure 10:
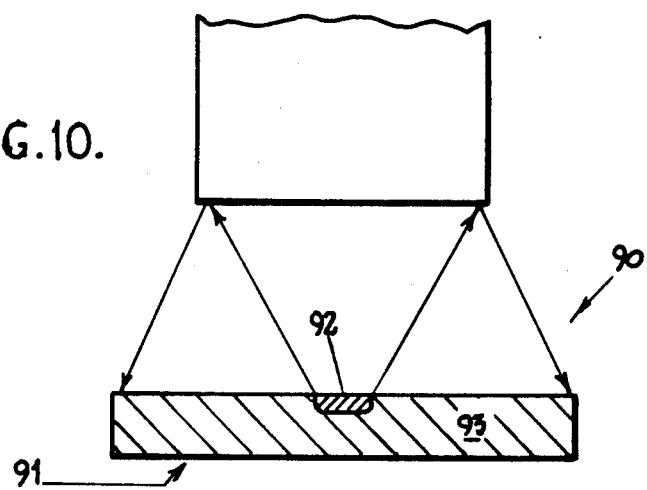

Referring now to FIG. 10, a ninth terminal 90 includes a semiconductor substrate 91 which comprises both an optical receiver 93 and an optical emitter 92. The region forming the emitter 92 is conveniently formed by a suitable technique such as ion implantation or doping.

What we claim is:

1. A fibre-optic terminal for use with a bi-directional optical fibre, the terminal including:
    an optical receiver having a light receiving area positioned directly in the path of light emitted from an end of the optical fibre to receive said light; and
    an optical emitter including an area at a position adjacent said optical receiver from which light is emitted onto said end of the optical fibre, said position being directly in the path of light emitted from said end of the optical fibre so that substantially all of the light emitted from said optical emitter is directly incident on said end of the optical fibre, and so that the emitter prevents some light from striking the optical receiver from the optical fibre, said area from which said optical emitter emits light being small relative to said light receiving area of said optical receiver so that the light emitted from said end of the optical fibre except for that striking the emitter is directly incident on said light receiving area of said optical receiver whereby the amount of light blocked by the emitter is small in comparison with the amount of light incident on the light receiving area of the optical receiver.

2. A terminal according to claim 1 wherein said position adjacent said optical receiver is intermediate said optical receiver and said end of the optical fibre.

3. A terminal according to claim 1 where said optical emitter is located at said position adjacent said optical receiver.

4. A terminal according to claim 1, wherein a light generating part of said optical emitter is located at a position remote from said position adjacent said optical receiver and light generated by said part of the optical emitter is fed to said area at a position adjacent said optical receiver via a second optical fibre.

5. A terminal according to claim 4 for use with a single strand optical fibre wherein said position adjacent said optical receiver is adjacent said end of the single strand optical fibre and an end of the second optical fibre feeding light generated by said part of the optical emitter is affixed to said end of the single strand optical fibre.

6. A terminal according to claim 5 wherein said optical receiver is also affixed to said end of the single strand optical fibre.

7. A terminal according to claim 1, for use with a single strand optical fibre wherein said position adjacent said optical receiver is adjacent said end of the optical fibre and said area of the optical emitter from which light is emitted is affixed to said end of the single strand optical fibre.

8. A terminal according to claim 7 wherein said optical receiver is also affixed to said end of the single strand optical fibre.

9. A terminal according to claim 1 wherein said optical receiver and said optical emitter are positioned at opposite ends of a second optical fibre.

10. A terminal according to claim 9 wherein said second optical fibre contains a grounded layer of semiconductor material which is transparent at the optical wavelength of operation of said optical receiver and/or said optical emitter.

11. A terminal according to claim 1 wherein said optical receiver is formed from a semiconductor substrate, said optical emitter being formed in said semiconductor substrate.

12. A terminal according to claim 1 wherein the optical emitter emits a cone of light.

13. A terminal according to claim 1 wherein the optical emitter is centrally disposed in the center of the light receiving area of the optical receiver.

* * * * *